United States Patent [19]

Bate et al.

[11] 4,141,026

[45] Feb. 20, 1979

[54] HALL EFFECT GENERATOR

[75] Inventors: Robert T. Bate, Garland; Raymond K. Erickson, Jr., Missouri City, both of Tex.

[73] Assignee: Texas Instruments Incorporated, Dallas, Tex.

[21] Appl. No.: 764,931

[22] Filed: Feb. 2, 1977

[51] Int. Cl.² .................. H01L 27/22; H01L 29/82; H01L 29/96
[52] U.S. Cl. ....................................... 357/27; 307/309
[58] Field of Search .................. 357/26, 27; 307/308, 307/309

[56] References Cited

U.S. PATENT DOCUMENTS

| | | | |
|---|---|---|---|
| 3,994,010 | 11/1976 | Geske | 357/27 |
| 3,997,909 | 12/1976 | Vinal | 357/27 |
| 4,021,767 | 5/1977 | Nonaka et al. | 357/27 |
| 4,025,941 | 5/1977 | Kanda et al. | 357/27 |
| 4,028,718 | 6/1977 | Migitaka et al. | 357/27 |

Primary Examiner—Andrew J. James
Attorney, Agent, or Firm—Rene' E. Grossman; Leo N. Heiting; Thomas G. Devine

[57] ABSTRACT

A semiconductor body has formed on it at least two hall effect plates each having a pair of oppositely positioned current contacts and a pair of oppositely positioned hall voltage contacts, the hall effect plates being positioned with respect to each other such that a line of one bisecting the current terminals is generally orthogonal to a line of the other bisecting the current terminals. Means are provided for applying a voltage across the current terminals of both of the hall plates and means are provided for selectively applying a magnetic field that intersects substantially perpendicularly the plane of the hall plates. The positive hall voltage contacts are connected together and the negative hall voltage contacts are connected together, with output circuitry connected to this interconnecting circuitry for receiving and transmitting an electrical signal indicative of the presence of the intersecting magnetic field.

25 Claims, 12 Drawing Figures

HALL EFFECT GENERATOR

BACKGROUND OF THE INVENTION

1. Field of the Invention

This invention relates to hall effect generators and more particularly to hall effect generators made up of multiple orthogonal pairs of hall effect plates with their output contacts connected in parallel.

2. Description of the Prior Art

The application of the hall effect in semiconductors to contactless mechanically-actuated switching has been known for many years. Until recently, however, hall effect devices had not come into widespread use because of their high cost and low sensitivity. It has been felt that to achieve sufficient output voltage with low offset, it was necessary to employ high mobility materials such as InAs-InP alloys for generators, but inexpensive production methods for these materials and devices have not been developed.

Progress in silicon technology has now made it possible to overcome the low mobility and poor sensitivity of silicon by fabricating circuits in which hall effect generators, preamplifiers, signal conditioning circuits and trigger circuits are integrated on the same semiconductor chip.

Although sensitivity and temperature effects are problem areas, the major problem in silicon hall effect generators is offset voltage; i.e., the residual output voltage when no magnetic field is applied. This voltage arises when the required symmetry of the generator is not preserved, and can result from various influences, such as mask and alignment errors, doping inhomogeneities, non-uniform diffusion at contacts or at the periphery of the generator, shear stresses, extended defects, etc. The combined effect of these influences leads to offset voltages which vary unpredictably from chip to chip over a slice and which may be comparable to or exceed the anticipated hall voltage.

The current approach to this problem involves individual functional probling and possibly trimming of each chip on a slice, and this significantly increases slice cost.

The present invention, by positioning a pair of hall effect plates in orthogonal relationship to each other and using a plurality of such orthogonal pairs with the hall voltage contacts connected in parallel, reduces the cost of fabrication because absolute accuracy of alignment and masks, as well as total freedom from stress error voltages is not required.

BRIEF SUMMARY OF THE INVENTION

In this preferred embodiment, two pairs of orthogonally disposed hall effect plates formed on a semiconductor chip, appropriately positioned and interconnected provide a hall effect generator with offset voltage substantially removed. The hall effect plates of the preferred embodiment described herein are substantially identical and diamond-shaped. At directly opposite points of the diamond-shaped plate are located a pair of current contacts and at the other points of the diamond are located a pair of hall voltage contacts. An orthogonal pair is positioned so that a line bisecting the current contacts of one hall effect plate is substantially orthogonal to a line bisecting the contacts of the other hall effect plate. A second orthogonal pair, identical to the pair described above, is formed next to the first orthogonal pair so that two plates with abutting sides are oriented so that lines drawn through each of their respective current contacts are substantially orthogonal to each other. Provision is made for applying a bias voltage across the current terminals of each cell and provision is also made for selectively applying a magnetic field that intersects the plane of the hall effect plates at substantially right angles. The positive hall voltage contacts are connected together and the negative hall voltage contacts are connected together, the polarity of the voltage being determined from the polarity of the applied bias voltage across the current contacts and the magnetic field direction. Output circuitry is employed to receive and transmit an output electrical signal indicative of the presence of the intersecting magnetic field. The output circuitry may include an amplifier and it may include, in addition to the amplifier, hysteresis circuitry, such as a flip flop, all formed on the same semiconductor chip as the hall effect generator.

It is therefore the primary object of this invention to provide a hall effect generator with substantially no offset voltage.

It is also an object of this invention to provide a hall effect generator that is relatively inexpensive to manufacture.

These and other objects will be made obvious in the detailed description that follows.

DETAILED DESCRIPTION OF THE INVENTION

Figure 1:
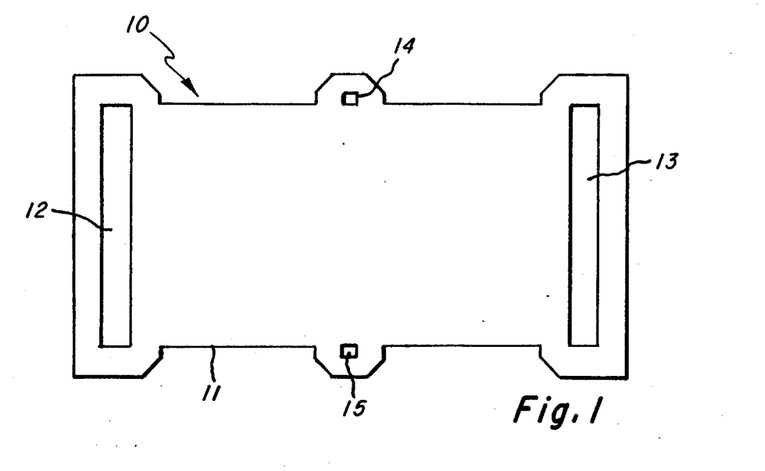
FIG. 1 is a top view of a standard hall plate (SHP).

FIG. 1 illustrates a standard hall plate (SHP) 10 having a semiconductor body 11 with current contacts 12 and 13 and hall voltage contacts 14 and 15. This hall plate could, of course, be made of a metal such as bismuth.

$V_{out}$ is measured at the hall voltage contacts 14 and 15 and can be expressed:

$$V_{out} = V_H + V_{offset} \tag{1}$$

where the hall voltage is given by $$V_H = \alpha \tan \theta \, V_a \tag{2}$$

The applied bias voltage is $V_a$ and $\tan \theta = 10^{-8} H$ is the tangent of the hall angle which is proportional to the product of the carrier mobility in $cm^2(V\text{-sec})^{-1}$ and the magnetic field intensity in oersteds. The dimensionless parameter $\alpha$ is characteristic of the geometry of the hall device and maximization of α will maximize the desired output voltage. Another relation is:

$$V_{offset} = \epsilon V_a \quad (3)$$

where the dimensionless parameter $\epsilon$ is ideally zero but actually depends on the extraneous factors mentioned previously. Optimization requires minimization of $\epsilon$.

Finally:

$$R_{in} = \gamma \rho_s \quad (3')$$

where $R_{in}$ is the resistance which the generator presents to the bias supply leads and $\rho_s$ is the sheet resistivity of the silicon comprising the generator. The power dissipation in the generator is $$P_{in} = V_a^2/R_{in} = V_a^2/\gamma \rho_s \quad (4)$$

so that minimization of power for a given $\rho_s$ requires maximization of $\gamma$.

Alternatively the hall voltage can be expressed in terms of the power input using equations (2) and (4):

$$V_H = \beta \tan\theta \, \rho_s^{\frac{1}{2}} P_{in}^{\frac{1}{2}} \quad (5)$$

where $\beta = \gamma^{\frac{1}{2}} \alpha$, the voltage/power figure of merit.

Summarizing the important equations:

$$V_{out} = V_H + V_{offset} \quad (1)$$

$$V_H = \alpha \tan\theta \, V_a \quad (2)$$

$$V_{offset} = \epsilon V_a \quad (3)$$

$$V_H = \beta \tan\theta \, \rho_s^{\frac{1}{2}} P_{in}^{\frac{1}{2}} \quad (5)$$

$$\tan\theta = 10^{-8} \mu H$$

As an example of the optimization envisioned, consider the optimization of the SHP of FIG. 1. It is constrained to be rectangular with equipotential surface covering both ends and point contacts for the output voltage. Assume $\tan\theta << 1$, $\epsilon = 0$ and fixed $\rho_s$. Under these constrains the optimization variable is the width-to-length ratio, W/L, and $$\alpha = f(W/L), \beta = (L/W)^{\frac{1}{2}} F(W/L),$$

where $$f(W/L) = (8/\pi^2) \sum_{k=0}^{\infty} (-\tau)^k (2k+1)^{-2} \tanh(k+\frac{1}{2})\pi W/L \quad (6)$$

Through imperical testing, it is obvious that the optimization involves trading off output voltage against input power. If it is assumed that additional power expended to increase $V_H$ above 95% of its maximum value is wasted, then the optimal range becomes:

$$0.75 < W/L < 1.2 \quad 0.833 \leq W/L < (4/3) \quad (7)$$

for which α and β lie in the ranges:

$$0.602 < \alpha < 0.707 \quad (8)$$

$$0.695 > \beta > 0.642 \quad (9)$$

Figure 2A:
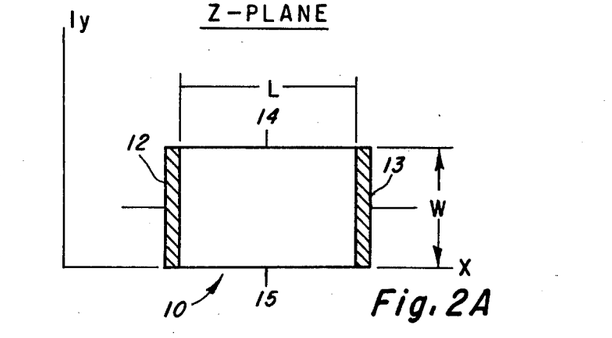
FIGS. 2a and b are diagrammatic representation of a mathematical conformal transformation.
Figure 2B:
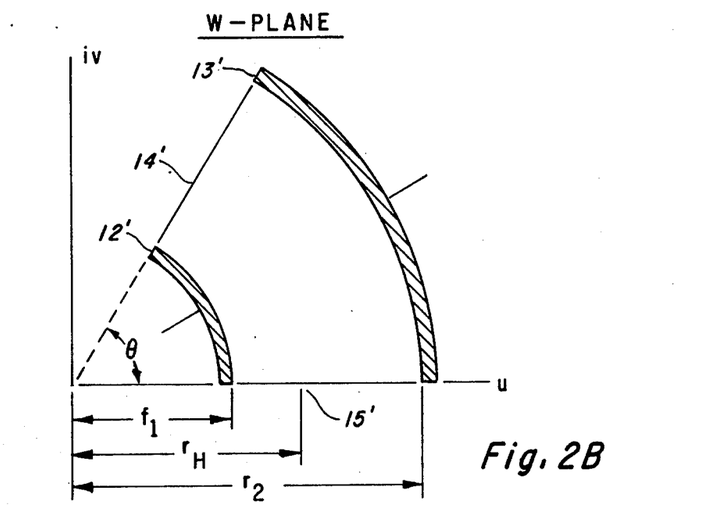

The SHP can be subjected to the conformal transformation of FIGS. 2A and 2B:

$$w = \exp z \quad (10)$$

which converts it into a semitorus. This geometry is of interest in reduction of offset voltages.

In FIG. 2A, the SHP is graphically represented, having width W and length L.

In FIG. 2B, the hall probes 14' and 15' are located at a radial distance $r_H = (r_1 r_2)^{\frac{1}{2}}$ from the center, where $r_1$ and $r_2$ are the inner and outer radii. The equivalent value of W/L is computed from the formula $$(W/L)_{equiv} = \theta [ln(r_2/r_1)]^{-1} \quad (11)$$

For $\theta = 2\pi$, the optimal range of $r_2/r_1$ which satisfies the conditions (8) and (9) becomes $$4348 > (r_2/r_1) > 188 \quad (12)$$

a range of values which is difficult to achieve except for rather large devices. A practical equivalent configuration is a truncated triangle where $r = C$, $r_H = X_x$ and $r_2 = L$.

In this practical example, the offset voltage due to contact misalignment is not constant over the length of the cell as was the case with the SHP. The offset voltage in this case is given by:

$$V_e = V_{cc} [\Delta X/X_c ln(L/C)]$$

This error voltage varies as the reciprocal of the hall contact pair location along the cell. To minimize this offset voltage for a given L/C ratio, the hall contacts should be located at the largest cell width or at $X_c = L$. However, the large current contact located at $X = L$ will short out the hall voltage in this region. To minimize the shunting effects of the current contacts, the hall contacts should be located at the geometric mean or $X_c = \sqrt{LC}$. Placement of the hall contacts at the geometric mean yields as offset voltage given by $$V_e^1 = V_{cc} \left[ \frac{\Delta X}{\sqrt{LC} \ln(\frac{L}{C})} \right] = V_{cc} \left[ \frac{\Delta X}{\sqrt{L}} \cdot \frac{1}{\sqrt{C} \ln(\frac{L}{C})} \right]$$

Figure 3A:
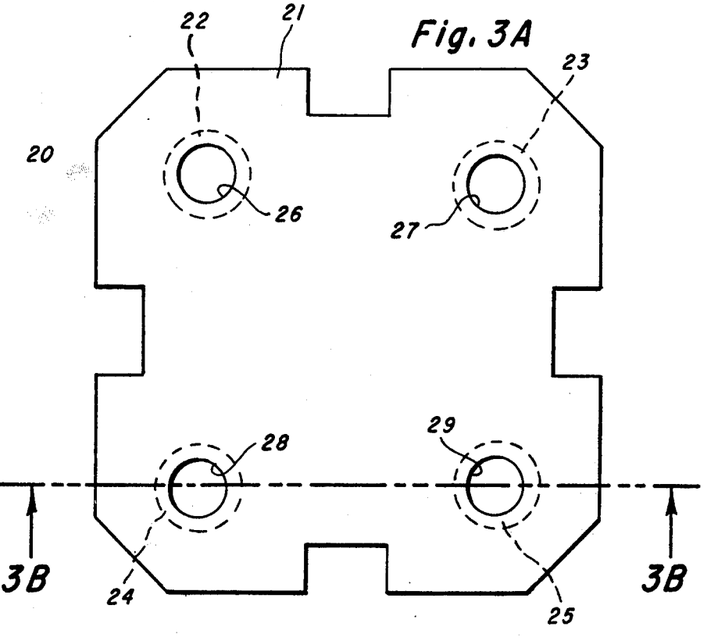
FIG. 3A is the top view of a diamond-shaped hall effect plate and FIG. 3B is an elevation of the plate of FIG. 3A taken along the line 3B.

FIG. 3A illustrates a diamond-shaped hall effect plate 20 which can be thought of as two "back to back" semitoruses. This device can produce an output voltage as large as the SHP with a power consumption of up to 16% less.

In this configuration, the hall voltage contacts 22 and 25 (or 23 and 24) are placed at the widest portion of the cell. This geometrical placement of these contacts locates these contacts optimally from both an offset voltage and sensitivity standpoint.

In this preferred embodiment, it should be noted that the current contacts and the hall voltage contacts are interchangeable.

Figure 3B:
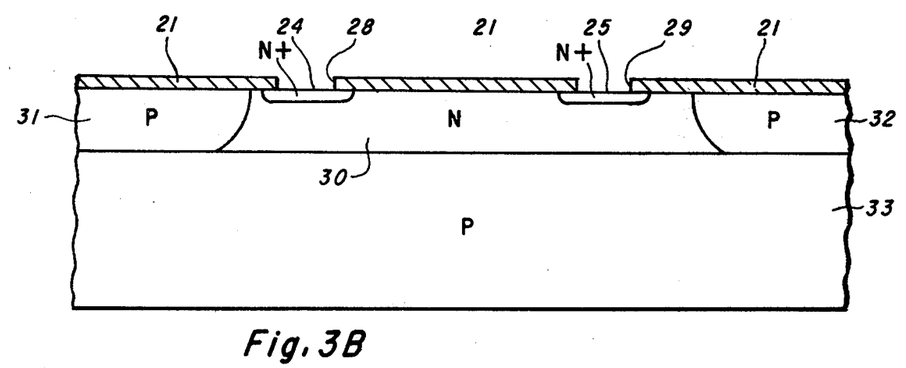

FIG. 3B illustrates a P material substrate 37 with an N material epitaxial layer 30 formed thereon. P material 31 and 32 is introduced into the epitaxial layer to isolate and define the hall effect plate 20. A silicon oxide protective layer 21 is formed over the epitaxial layer 30 and holes 26–29 are formed therein to expose contacts 22–25 which are of N+ material formed in the N material of the epitaxial layer 30.

The analysis of the offset voltage follows the semitorus case and is given by $$V_e'' = V_{cc} [2\Delta X/ln(L/C)L]$$

This simplified analysis indicates an improvement over the SHP of a factor 2/Ln(L/C).

In the absence of a magnetic field, the electric field is related to the current density at any point by the equation:

$$E = \rho J \quad (15)$$

where in the two-dimensional approximation, the resistivity tensor has the form:

$$\rho = \begin{pmatrix} \rho_{xx} & 0 \\ 0 & \rho_{xx} \end{pmatrix} \quad (16)$$

Figure 4:
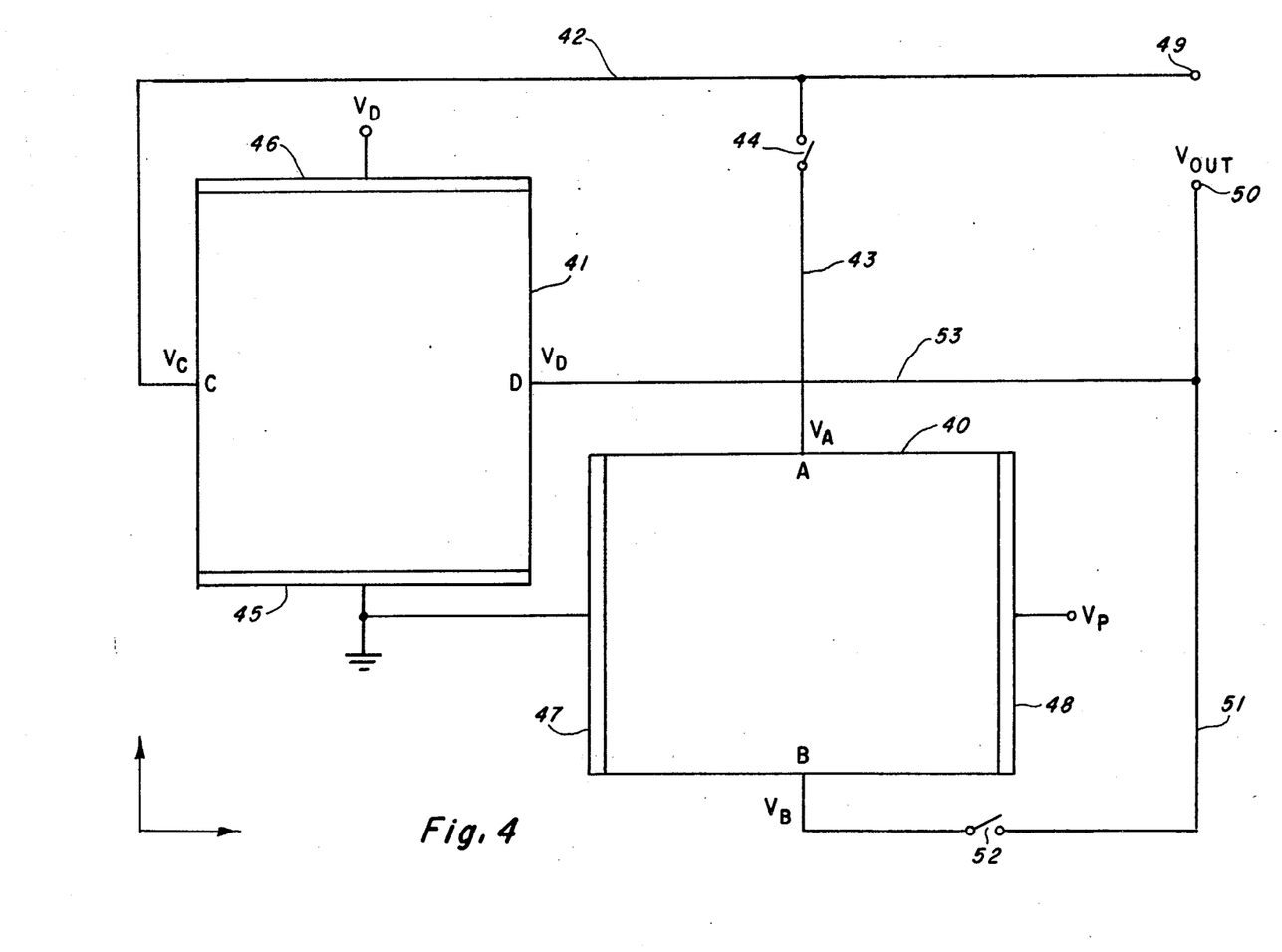
FIG. 4 schematically illustrates the electrical hookup of a pair of orthogonal HPS's.

If the chip is subjected to a shear stress because of differential expansion effects or flexure of the package, the resistivity tensor becomes:

$$\rho' = \begin{pmatrix} \rho'_{xx} & \rho'_{xy} \\ \rho'_{xy} & \rho'_{yy} \end{pmatrix} \quad (17)$$

and if a weak magnetic field is applied, it becomes:

$$\rho'(H) = \begin{pmatrix} \rho'_{xx} & \rho'_{xy} - RH \\ \rho'_{xy} + RH & \rho'_{yy} \end{pmatrix} \quad (18)$$

where R is the hall coefficient. Referring now to FIG. 4, for generator 40 $j_y = 0$ and $E_y = (\rho_{xy}' - RH) j_x$. Therefore $$(V_A - V_B) = V_y = (\rho_{xy}' - RH) I_x/t = V_{offset} - V_H$$

The offset parameter, $\epsilon$, defined in equation (3) is given by $$\epsilon = (\rho_{xy}'/\rho_{xx}') (W/L).$$

Another SHP 41 is located near SHP 40 but at right angles to it and for SHP 41, $j_x = 0$, $$(V_D - V_C) = V_x = (\rho_{xy}' + RH) I_y/t = V_{offset} + V_H \quad (20)$$

Hall contact C of SHP 41 is connected by way of conductor 42 through switch 44 and conductor 43 to hall conductor A of SHP 40. Hall voltage contact D of SHP 41 is connected by way of conductors 53 and 51 through switch 52 to hall voltage contact B of SHP 40. Bias voltage is applied to current contacts 46 and 48 of hall plates 41 and 40, respectively, and the current contacts 45 and 47 of SHP 41 and 40, respectively, are connected to ground. Output terminals 49 and 50 are connected, respectively, to conductors 42 and 51.

With switches 44 and 52 closed, the points A and C now are constrained to be at the same potential. The same is true of B and D. The resulting voltage difference is, to first order:

$$V_{BD} - V_{AC} = \tfrac{1}{2}[(V_B - V_A) + (V_D - V_C)] =$$
$$\tfrac{1}{2}[(-V_{offset} + V_H) + (V_{offset} + V_H)] = V_H \quad (21)$$

The offset voltage due to uniform shear stress thus cancels out to first order for pairs of orthogonal generators connected together as in FIG. 4.

Connecting two or more generators on the same chip together can also reduce the influence of geometrical effects under certain circumstances. Suppose that there are n generators on a chip and that the probability that a given single sensor will have $V_{offset} = \delta$ is given by the normal probability function:

$$P^{-1}(\delta) = \sigma(2\pi)^{\frac{1}{2}} \exp[(\delta-\mu)^2/2\sigma^2] \quad (22)$$

where there is the possibility that the function peaks at a value $\delta = \mu$ which is non-zero.

With the n generators connected with their hall voltage contacts in parallel as the reciprocal of the probability that the combination will have an offset voltage $\delta$ can be shown to be $$P_n^{-1}(\delta) = \sigma_n(2\pi)^{\frac{1}{2}} \exp[(\delta-\mu)^2/2\sigma_n^2] \quad (23)$$

where $\sigma_n = \sigma n^{-\frac{1}{2}}$. The reciprocal probability of zero offset is $$P_n^{-1}(0) = \sigma(2\pi)^{\frac{1}{2}} n^{-\frac{1}{2}} \exp(n\mu^2/\sigma^2) \quad (24)$$

The condition that the probability of zero offset will be greater for the combination of interconnected sensors than for the single sensor is $$P_n(0) < P_1(0) \quad (25)$$

which requires:

$$\mu^2/\sigma^2 < \ln(n)/[2(n-1)] \quad (26)$$

Thus, connecting several sensors together can increase the probability of zero offset provided the probability function is not excessively "skewed" toward one direction of offset. For an unskewed distribution ($\mu = 0$):

$$P_n(0) = n^{\frac{1}{2}} P_1(0) \quad (27)$$

so that, in this case for example, connecting four generators together could decrease the yield loss due to offset voltage by a factor of 2.

If a finite offset is allowable, the improvement can be greater. As an example, consider a group of generators characterized by an unskewed ($\mu = 0$) distribution with $\sigma = 5$mV. If offset $\delta' = 3$mV or less is acceptable, then the probability that a given single generator is acceptable is erf($\delta'/2\sigma$) = 0.452, while the probability that a combination of four generators is acceptable is erf($\delta^2/2\sigma_4$) = 0.769. Thus, the yield loss for a single generator is 54.8% while that for the combination is only 23%.

The concepts of shear voltage cancellation by orthogonal generators and offset voltage reduction by statistical averaging, can be realized by any even number of orthogonal generator pairs with parallel hall voltage contacts. Extensions of these concepts to multiple differential amplifier/hall generator combinations would reduce the combined generator/amplifier offset voltage.

The hall magnetic generator output voltage is dependent on the type of carrier employed. The mobility of electrons in silicon is greater than the mobility of holes. Since the hall voltage is directly proportional to the mobility of the carriers, the hall sensors should be constructed of an N type silicon with appropriate, shallow N+ diffusions for both the current and hall contacts as indicated in FIG. 3B.

The output voltage is also dependent on the carrier concentration within the hall generator. For concentrations greater than $10^{15}$ atoms/Cm$^3$ the carrier mobility is degraded. Concentration less than $10^{15}$ atoms/CM$^3$ increase the internal impedance of the generator such that generator loading becomes significant.

Figure 5A:
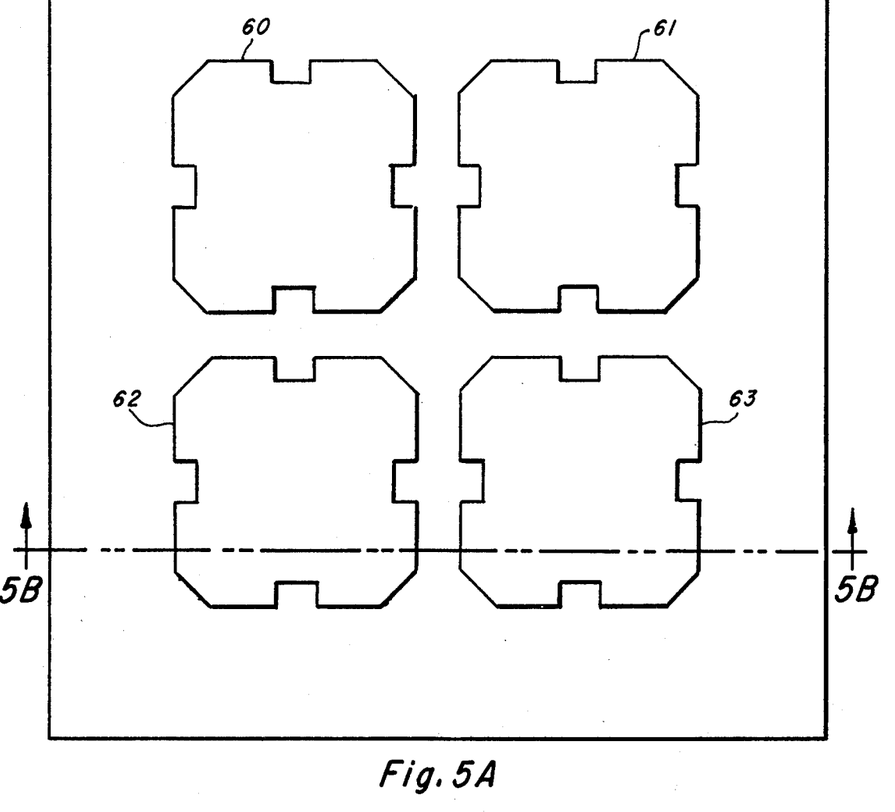
FIG. 5A illustrates an early step in the process of manufacturing two orthogonal diamond-shaped pairs and FIG. 5B is an elevation taken along line 5B.
Figure 5B:
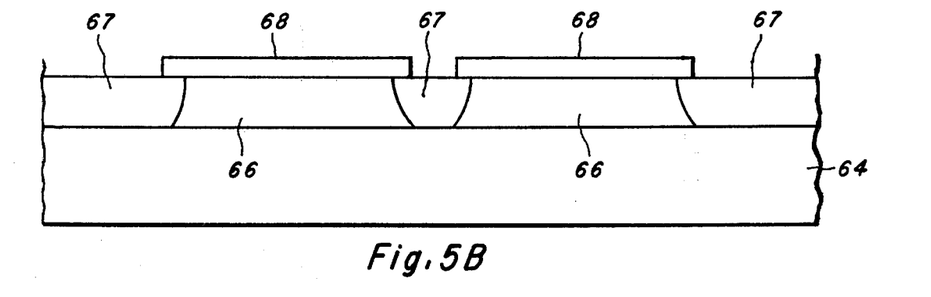

In the preferred embodiment, two orthogonal pairs of diamond-shaped generators 60–61 and 62–63 are formed as shown at FIGS. 5A and 5B. A P type starting material having 10 to 20 ohm-CM with 111 orientation forms a substrate 64 upon which an epitaxial layer 66 of N type material is grown. Protected layer 68 of silicon oxide are formed over the N type epitaxial material. P type isolation regions 67 are formed in the epitaxial layer to define the generators 60–63.

Figure 6A:
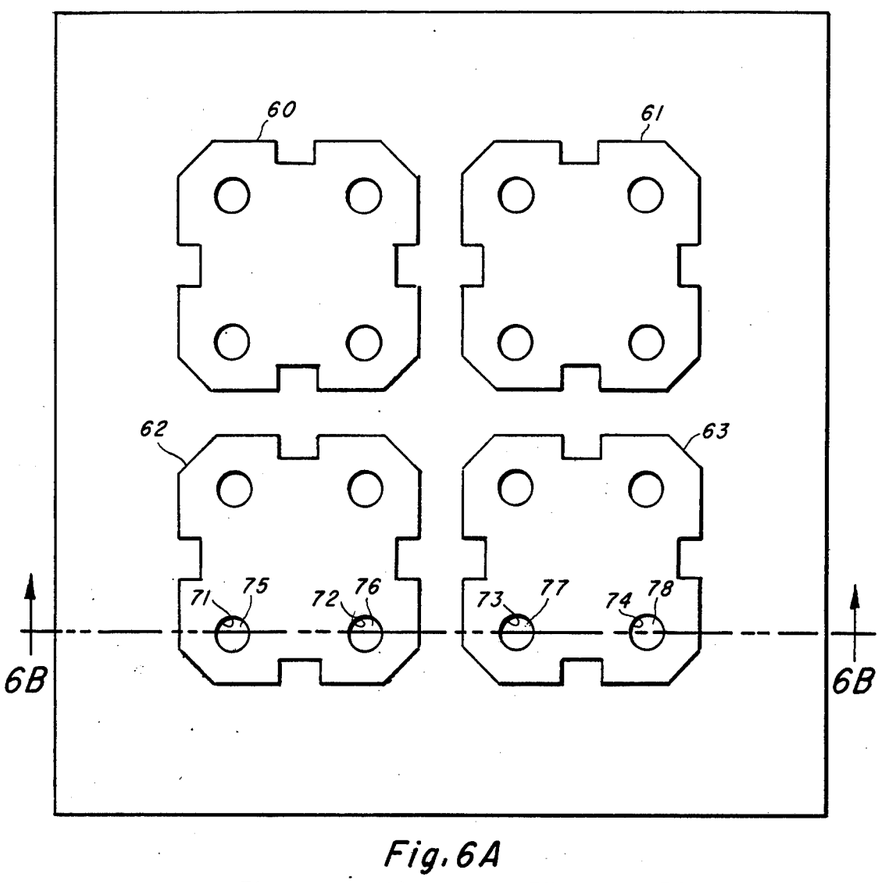
FIG. 6A is a further step in the manufacturing process of the two orthogonal diamond shaped pair and FIG. 6B is an elevation taken along line 6B.
Figure 6B:
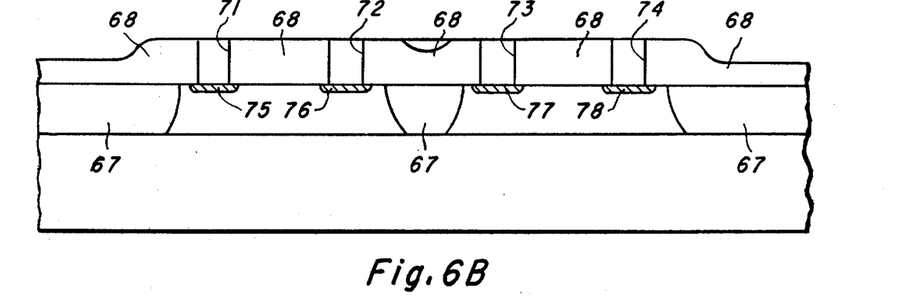
Figure 7A:
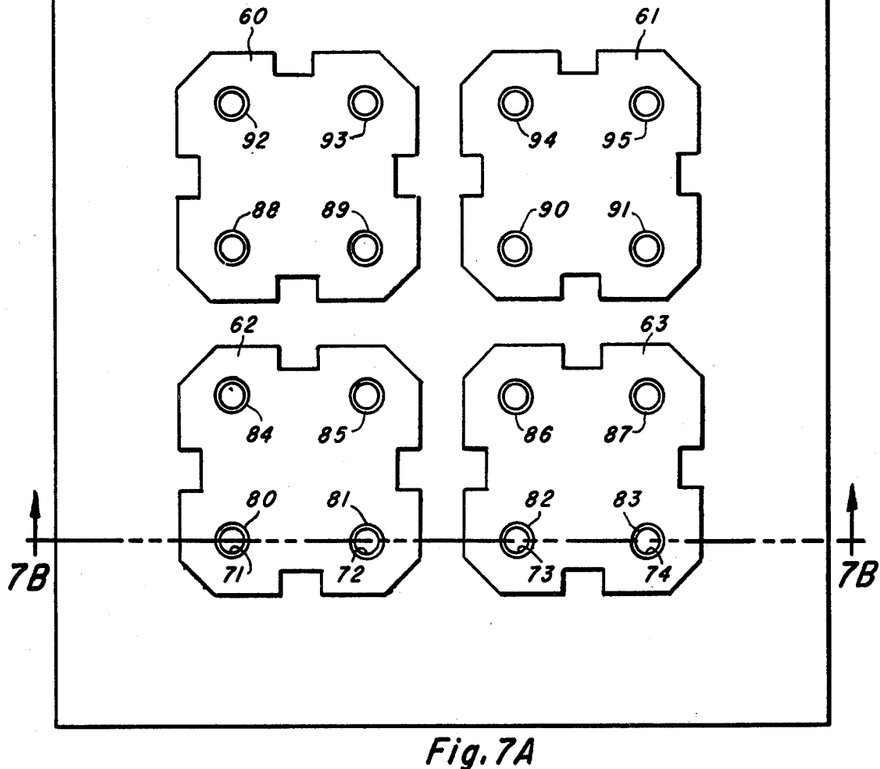
FIG. 7A illustrates a top view of a completed two orthogonal diamond shaped pair and FIG. 7B is an elevation taken along line 7B.
Figure 7B:
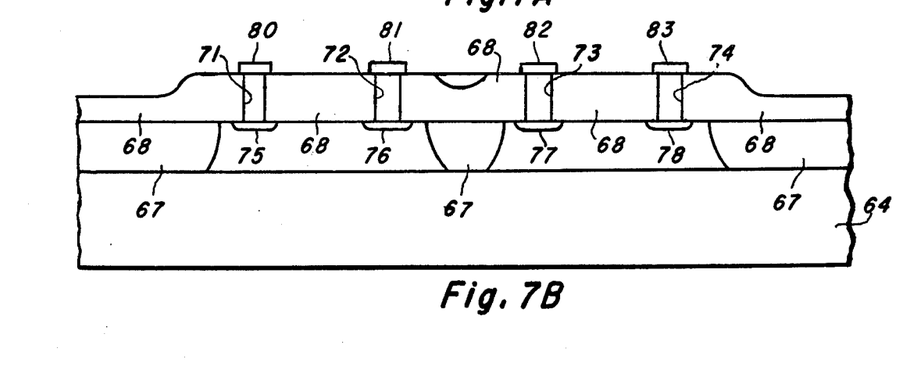

FIG. 6A and FIG. 6B illustrate a further step in the manufacturing process wherein contacts 75–78 of N+ type material are shown having been formed in the N type epitaxial layer 66. Also, further forming of a protective layer 68 is shown with contact openings 71-74 evident. These openings and contacts are shown for devices 62 and 63. The remaining contacts and openings in devices 62 and 63 and 60 and 61 are all identical and not shown in detail. The completed device is shown in FIGS. 7A and 7B. FIG. 7B illustrates metal conductors 80-83 having been installed in contact with contacts 75-78, respectively. The interconnections are not shown, but in this preferred embodiment, metal conductors 81 and 84 are connected to the hall voltage contacts of device 62, conductors 88 and 93 to the hall voltage contacts of device 60, conductors 91 and 94 connected to the hall voltage contacts of device 61 and conductors 82 and 87 are connected to the hall voltage contacts of device 63. The remaining two conductors on each device are connected to the bias voltage source and serve as current contacts. It should be remembered that in this preferred embodiment, the current contacts and the hall voltage contacts are completely interchangeable with the selection being made in an arbitrary fashion such that the pairs are orthogonal. The interconnections are not shown, but in FIG. 7B the bias voltage input is connected to metal conductors 92, 80, 95 and 83. Connected to ground are metal conductors 89, 90, 85 and 86. This power connection can be reversed. The hall voltage output is taken from metal conductors 81 and 82. Metal conductor 81 is connected to conductors 88, 94 and 87. Metal conductor 82 is connected to conductors 91, 83, and 84. In this way, a parallel connection of the hall voltage contacts is made.

In this preferred embodiment an optimal hall plate is in the form of a diamond having equal length sides. Placed together in an orthogonal pair, they provide offset voltage reduction by way of reducing stress voltage. By connecting these orthogonal pairs in parallel with other orthogonal pairs, not only is there a stress cancellation, but also an offset voltage cancellation caused by the reasons enumerated earlier.

Although the preferred embodiment has illustrated simply two orthogonal pairs to make up the preferred device, is should be understood that the invention is not limited to the combination of two pairs, but more can be added as desired. Also, altthough the preferred diamond-shaped device is shown, certainly rectangular devices or any other desired shape can be used in the same fashion.

Also, although an N type epitaxial material has been shown as the preferred embodiment for the body of the hall effect generator, it is not intended that the invention be limited to such material, but that other semiconductor materials and metals be contemplated. The metals and materials are well known to those having skill in the art. Furthermore, the application of connecting orthogonal pairs in parallel is contemplated for use in active semiconductor devices. Of course, as mentioned earlier, it is well known that amplifiers and hysteresis elements may be connected to the output of the orthogonal pairs for various purposes such as switching and linear application.

What is claimed is:

1. An improved, integrated circuit hall generator comprising:
   (a) at least two hall effect plates formed on a semiconductor body, each having a pair of oppositely positioned current contacts and a pair of oppositely positioned hall voltage contacts positioned with respect to each other such that a line drawn bisecting the current contacts of one hall plate is substantially orthogonal to a line bisecting the current contacts of the other hall plate;
   (b) means for applying a voltage across the current contacts of each of the hall plates;
   (c) means for selectively applying a magnetic field that intersects the hall plates substantially perpendicularly to the plane of the hall plates;
   (d) means for interconnecting the positive hall voltage contacts of each hall plate and means for interconnecting the negative voltage hall contacts of each hall plate, the hall voltages resulting from the application of the intersecting magnetic field; and
   (e) output means, attached to the interconnecting means, for receiving and transmitting a resultant electrical signal indicative of the intersecting magnetic field.

2. The generator of claim 1 wherein the hall plates comprise semiconductor material.

3. The generator of claim 2 wherein the hall effect plates are identical and of a rectangular shape with the current contacts positioned adjacent the shorter sides of width W and the hall voltage contacts positioned adjacent the longer sides of length L.

4. The generator of claim 3 wherein the rectangular hall plates are dimensioned so that the ratio W/L is greater than 0.75 and less than 1.2.

5. The generator of claim 1 wherein the hall effect plates comprise metal.

6. The generator of claim 5 wherein the hall effect plates are identical and of a rectangular shape with the current contacts positioned adjacent the shorter sides of width W and the hall voltage contacts positioned at the longer sides of length L.

7. The generator of claim 6 wherein the rectangular hall effect plates are dimensioned so that W/L is greater than 0.75 and less than 1.2.

8. The generator of claim 2 wherein the hall effect plates are formed generally as substantially identical truncated triangles with their lengths substantially orthogonally disposed to each other, each having a current contact adjacent the base of the triangle, the hall voltage contacts being positioned adjacent the opposite sides of the triangle between the current contacts.

9. The generator of claim 5 wherein the hall effect plates are formed generally as substantially identical truncated triangles with their lengths substantially orthogonally disposed to each other, each having a current contact adjacent the base of the triangle, the hall voltage contacts being positioned adjacent the opposite sides of the triangle between the current contacts.

10. The generator of claim 2 wherein the hall plates are diamond-shaped with current contacts positioned at opposite points of the diamond-shaped plate and with hall voltage contacts positioned at the other points.

11. The generator of claim 10 wherein the length of the sides of the diamond-shaped hall plates is equal and the current contacts and the hall voltage contacts are interchangeable.

12. The generator of claim 5 wherein the hall plates are diamond-shaped with current contacts positioned at opposite points of the diamond-shaped plates and with hall voltage contacts positioned at the other points.

13. The generator of claim 12 wherein the length of the sides of the diamond-shaped hall plates is equal and the current contacts and the hall voltage contacts are interchangeable.

14. An improved, integrated circuit hall generator comprising:

(a) at least two pairs of hall effect plates formed on a semiconductor body, the hall effect plate of each pair having a pair of oppositely positioned current contacts and a pair of oppositely positioned hall voltage contacts positioned with respect to each other such that a line drawn bisecting the current contacts of one hall plate is substantially orthogonal to the line bisecting the current contacts of the other hall plate of the pair, and the two pairs positioned with respect to each other so that all of the lines drawn bisecting current contacts are mutually orthogonal;

(b) means for applying a voltage across the current contacts of each of the hall plates;

(c) means for selectively applying a magnetic field that intersects the hall plates substantially perpendicularly to the plane of the hall plates;

(d) means for interconnecting the positive hall voltage contacts of each hall plate and means for interconnecting the negative voltage hall contacts of each hall plate, the hall voltages resulting from the application of the intersecting magnetic field; and (e) output means, attached to the interconnecting means for receiving and transmitting a resultant electrical signal indicative of the intersecting magnetic field.

15. The generator of claim 14 wherein the hall plates comprise semiconductor material.

16. The generator of claim 15 wherein the hall effect plates are identical and of a rectangular shape with the current contacts positioned adjacent the shorter sides of width W and the hall voltage contacts positioned adjacent the longer sides of length L.

17. The generator of claim 16 wherein the rectangular hall plates are dimensioned so that the ratio W/L is greater than 0.75 and less than 1.2.

18. The generator of claim 14 wherein the hall effect plates comprise metal.

19. The generator of claim 18 wherein the hall effect plates are identical and of a rectangular shape with the current contacts positioned adjacent the shorter sides of width W and the hall voltage contacts positioned at the longer sides of length L.

20. The generator of claim 19 wherein the rectangular hall effect plates are dimensioned so that W/L is greater than 0.75 and less than 1.2.

21. The generator of claim 15 wherein the hall effect plates are formed generally as substantially identical truncated triangles with their lengths substantially orthogonally disposed to each other, each having a current contact adjacent the truncated apex of the triangle and the other current contact adjacent the base of the triangle, the hall voltage contacts being positioned adjacent the opposite sides of the triangle between the current contacts.

22. The generator of claim 14 wherein the hall plates are diamond-shaped with current contacts positioned at opposite points of the diamond-shaped plate and with hall voltage contacts positioned at the other points.

23. The generator of claim 22 wherein the length of the sides of the diamond-shaped hall plates is equal and the current contacts and the hall voltage contacts are interchangeable.

24. The generator of claim 18 wherein the hall plates are diamond-shaped with current contacts positioned at opposite points of the diamond-shaped plate and with hall voltage contacts positioned at the other points.

25. The generator of claim 24 wherein the length of the sides of the diamond-shaped hall plates is equal and the current contacts and the hall voltage contacts are interchangeable.